United States Patent [19]

Cho et al.

[11] Patent Number: 5,837,407
[45] Date of Patent: Nov. 17, 1998

[54] METHOD FOR MAKING A SCREEN PANEL FOR A COLOR CRT

[75] Inventors: Jong-ho Cho, Kyungki-do; Choong-lak Kim, Daejeon-si, both of Rep. of Korea

[73] Assignee: Samsung Display Devices Co., Ltd., Kyungki-do, Rep. of Korea

[21] Appl. No.: 797,970

[22] Filed: Feb. 12, 1997

[30] Foreign Application Priority Data

Nov. 25, 1996 [KR] Rep. of Korea ............... 96-57051

[51] Int. Cl.$^6$ ............... G03C 5/00; G03G 13/00
[52] U.S. Cl. ............... 430/25; 430/28; 430/31
[58] Field of Search ............... 430/23, 25, 28, 430/31

[56] References Cited

U.S. PATENT DOCUMENTS

| | | | |
|---|---|---|---|
| 4,921,767 | 5/1990 | Datta et al. | 430/28 |
| 5,229,234 | 7/1993 | Riddle et al. | 430/23 |
| 5,240,798 | 8/1993 | Ehemann | 430/28 |
| 5,455,132 | 10/1995 | Ritt et al. | 430/28 |
| 5,455,133 | 10/1995 | Gorog et al. | 430/23 |

*Primary Examiner*—Roland Martin
*Attorney, Agent, or Firm*—Christie, Parker & Hale, LLP

[57] ABSTRACT

In a method forming a phosphor layer on a screen panel, the black matrix is made of a conductive material. The conductive black matrix is formed by a wet-layer photoconductive method. That is, an organic conductive layer is initially deposited on the screen panel, then an organic photoconductive material is formed on the organic conductive layer. The plotoconductive layer is charged to a positive or negative potential and a selective area of the organic photoconductive layer is exposed to light radiated from an exposure device, such that the potential can be left on the unexposed area where the black matrix will be deposited. Finally, the conductive black matrix material is deposited on the unexposed area.

5 Claims, 5 Drawing Sheets

P4

P5

R BM G BM B BM R BM G BM B BM R

METHOD FOR MAKING A SCREEN PANEL FOR A COLOR CRT

FIELD OF THE INVENTION

The present invention relates to a method for making a screen panel for color CRTs.

BACKGROUND OF THE INVENTION

Generally, a screen panel for CRTs is deposited with red(R), green(G), and blue(B) phosphor materials constituting a phosphor layer of the panel. To allow for the differentiation between the three phosphors and prevent color mixture, thereby improving color definition, a black matrix is disposed between the phosphors.

There are two different methods for forming the phosphor layer: a wet-layer method using a slurry and a dry-layer method using an electrophotographic screening process.

The wet-layer method has a drawback in that the manufacturing process is complicated. Also, the slurry used in the process pollutes the environment. Therefore, in recent years, the dry-layer method using an electrophotographic screening process has become widely developed to form the phosphor layer.

Such a method for forming the phosphor layer is disclosed in U.S. Pat. No. 5,455,133 to Istvan Gorog et al.

As seen from FIGS. 3 through 10 of the Patent, a screen panel 12 is initially prepared for the deposition of a black matrix 23. Then, the inner surface of the panel 12 is coated with an organic conductive material 32, on which an organic photoconductive layer 34 is formed.

The organic photoconductive layer 34 is electrostatically charged to a suitable potential using a corona discharge device 38. Then, the shadow mask 25 is disposed in front of the screen panel 12 to expose the organic photoconductive layer 34 to light from a light source 42 which projects light through the openings formed in the shadow mask 25. The light discharges the exposed areas of the organic photoconductive layer 34 where phosphor material will be deposited, but leaves a positive charge on the unexposed area of the organic photoconductive layer 34.

The positively charged area of the organic photoconductive layer 34 is directly developed by depositing thereon negatively charged particles of a black matrix from a developer 44 using a powder spraying method. The black matrix material includes iron manganese oxide, iron cobalt oxide, zinc iron sulfide, and insulating carbon black.

Next, to develop a phosphor layer, a second organic conductive layer 132 is covered on both the black matrix layer and the organic photoconductive layer 34, and a second additional organic photoconductive layer 134 is also covered on the second organic conductive layer 132. After this, the second organic photoconductive layer 134 is electrostatically charged at a uniform level over its surface using the corona discharge device. The shadow mask 25 is then inserted into the panel 12 and the positively charged second organic photoconductive layer 134 is exposed by light passing through the shadow mask 25 from a light source. The light, which passes through the apertures in the shadow mask 25 at an angle identical to that of one of the electron beams from the electron gun of the tube, discharges the illuminated areas on the second organic photoconductive layer 134. The shadow mask is removed from the panel 12 and the panel is placed into a developer (not shown) filled with positively charged one of R. G. B phosphor materials. This phosphor material is repelled by the positively charged areas on the second organic photoconductive layer 134 and deposited on the discharged areas thereof. These steps are repeated for depositing other phosphor materials.

However, when making the phosphor layer using the above described dry-layer method of the photoconductive screening process, since the black matrix is more positively charged than the organic photoconductive layer in the recharging steps of the phosphor layer screening process, the higher positive voltage on the black matrix layer repels the positively charged phosphor material so that the phosphor material does not completely fill the openings in the matrix but leaves undesirable small gaps. Thus, in addition to the organic conductive and organic photoconductive layers 32 and 34 that are required during the process of making the black matrix, as seen from FIGS. 9 and 10 of U.S. Pat. No. 5,455,133, additional conductive and photoconductive layers 132 and 134 are required during a process of making the phosphor layer, thereby increasing the number of needed processes and increasing manufacturing costs arising from the necessity to use additional organic photoconductive material which is expensive.

SUMMARY OF THE INVENTION

Therefore, the present invention has been made in an effort to solve the above described problems of the prior phosphor layer forming method.

It is an object of the present invention to provide a method for making a screen panel for CRTs, by which there is no need for additionally depositing organic conductive and organic photoconductive layers when forming the phosphor layer, thereby simplifying the process for making the screen panel and reducing manufacturing costs.

It is another object of the present invention to provide a method for making a screen panel for CRTs, which can precisely deposit phosphor materials on the desired position.

The above objects can be achieved by making the black matrix from a conductive material and by maintaining an electrostatic potential of the black matrix to be different from that of an organic photoconductive layer covered on the panel.

According to a feature of the present invention, the conductive black matrix is formed by a wet-layer photoconductive method. That is, an organic conductive layer is initially deposited on the screen panel, then an organic photoconductive material is formed on the organic conductive layer. The photoconductive layer is charged to a positive or negative potential and a selective area of the organic photoconductive layer is exposed to light, radiated from an exposure device, such that the potential can be left on the unexposed area where the black matrix will be deposited. Next, the conductive black matrix material is deposited on the unexposed area.

The panel, where the conductive black matrix is deposited, is electrostatically charged, and the charged panel is exposed to light radiated from a light source through openings formed on a shadow mask such that the charged potential can be left on the unexposed area and the charged potential can be discharged on both the exposed black matrix and an area, where one of red R, green G, and blue B phosphor materials is deposited, is discharged to an electrostatic potential of 0V. Voltage is then applied to the black matrix so that the conductive black matrix can be charged to an electrostatic potential which is lower than the left electrostatic potential. The phosphor material which is charged to the same polarity as that of the left potential on the panel is sprayed toward the panel so that the phosphor material can be deposited on the discharged area by repulsive force. Finally, the deposited phosphor material is fixed on the panel, and the above described steps are repeated for the rest of the phosphor material.

Preferably, the black matrix material includes a graphite as a main element thereof.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENT

Figure 1:
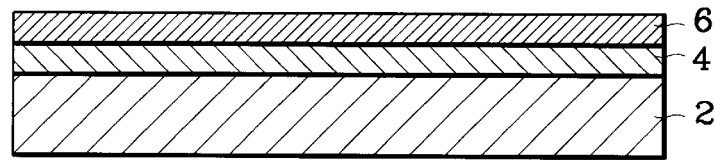
FIGS. 1 through 3 are sectional views of a screen panel during several conventional steps in a method according to a preferred embodiment of the present invention.

The following is the description of the preferred embodiments according to the present invention. In the drawings, like reference numerals have been used to identify like elements in each figure.

Figure 2:
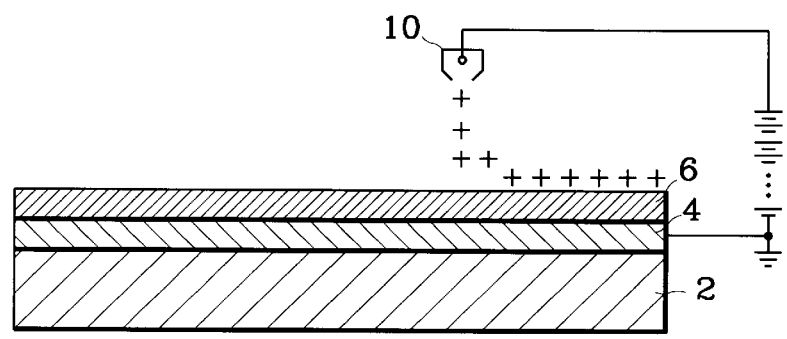
Figure 3:
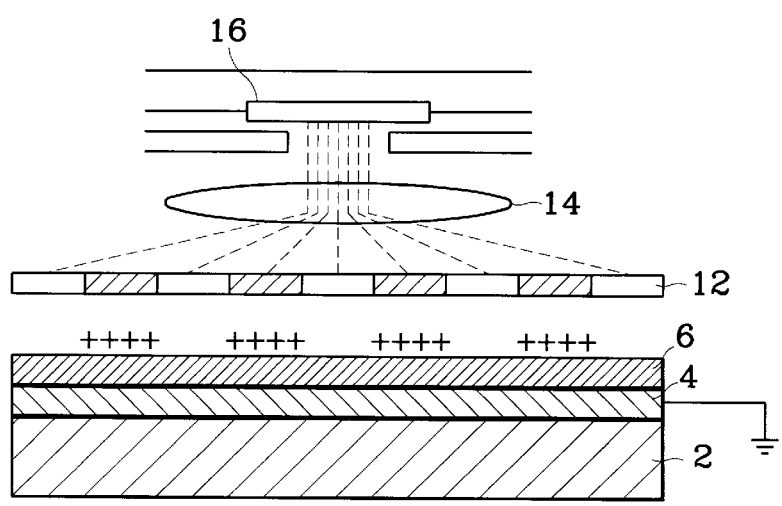
Figure 4:
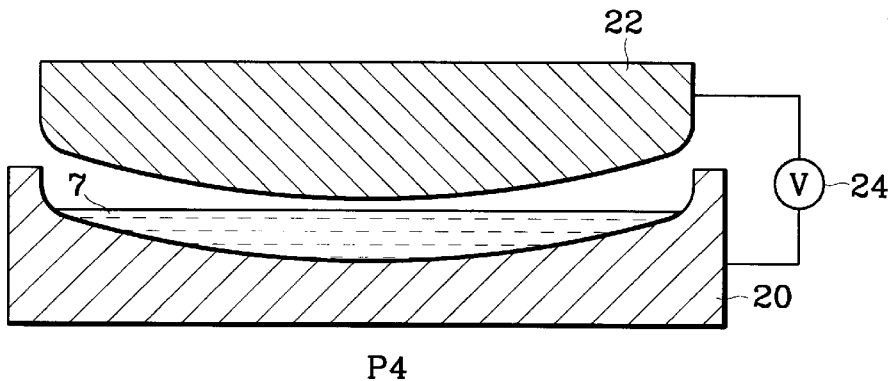
FIGS. 4 through 10 are sectional views of a screen panel during several inventive steps of a method according to a preferred embodiment of the present invention.
Figure 5:
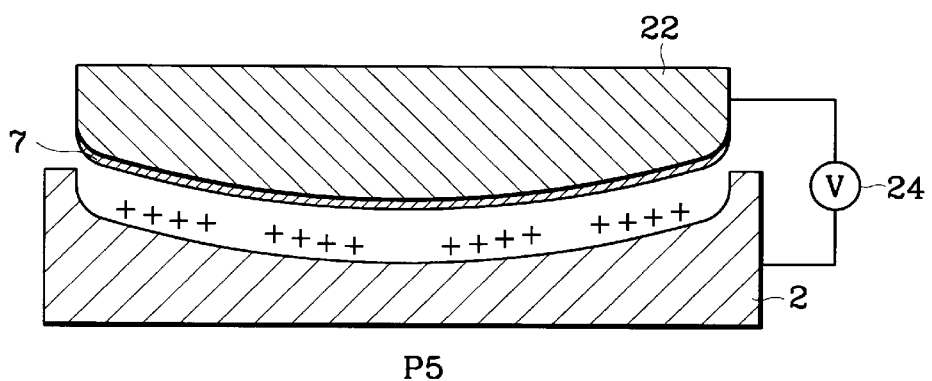

FIGS. 1 through 3 illustrates sectional views of a screen panel 2 during several conventional steps in a method according to a preferred embodiment of the present invention. As a first step, an inner surface of the screen panel 2 is coated with an organic conductive layer 4 on which an organic photoconductive layer 6 is formed as shown in FIG. 1. As a second step, in order to form a black matrix on the organic photoconductive layer 6, the organic photoconductive layer 6 is electrostatically charged to a suitable positive potential as shown in FIG. 2. In a third step, as shown in FIG. 3, a shadow mask 12 is disposed facing the inner surface of the screen panel 12 at a predetermined distance therefrom and the organic photoconductive layer 6 is exposed to light radiated from a light source 16 through an exposure lens 14 and the shadow mask 12, such that the positive potential remains on the unexposed area of the organic photoconductive layer 6 where the black matrix will be deposited. The above-described steps are the same as those of the prior art and the inventive steps will be described hereinafter.

That is, in a fourth step, a black matrix material 7, which is charged to a negative potential, is uniformly deposited on an outer surface of a developer 22 having a compliment configuration to that of the interior surface of the screen panel 2. That is, a container 20 is provided for containing the black matrix material therein. Both the container and developer 20 and 22 are connected to a voltage applying apparatus 24 to allow for the application of electricity therein. In this state, the developer 22 is dipped in the black matrix material 7 contained in the container 20 such that the negatively charged black matrix can be deposited on the developer 22. The black matrix material 7 includes graphite as a main element and additionally includes a high molecular compound, a charge regulator material, and iso paraffin. However, the black matrix material 7 is not limited to the above materials and any material can be used as long as it is conductive and has light absorbing qualities. Then, in a fifth step, the outer surface of the developer 22 contacts the inner surface of the screen panel 2 such that the negatively charged black matrix material 7 deposited on the outer surface of the developer 22 is developed on an area of the positively charge screen panel. During this step, if the conductive layer of the panel 2 and the developer 22 can be applied with same potential through the voltage applying apparatus 24, a more uniform and clear black matrix layer can be formed on the inner surface of the panel 2.

Figure 6:
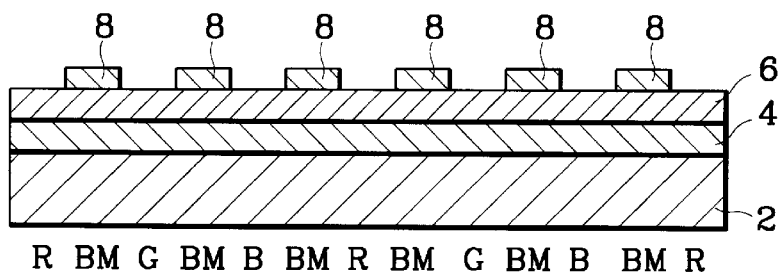

After depositing the black matrix 8 in a predetermined pattern as shown in FIG. 6, the phosphor layer can be deposited on the inner surface of the panel, on which the black matrix is deposited, according to the following steps which will be described hereinbelow with reference to FIGS. 6 through 10.

Figure 7:
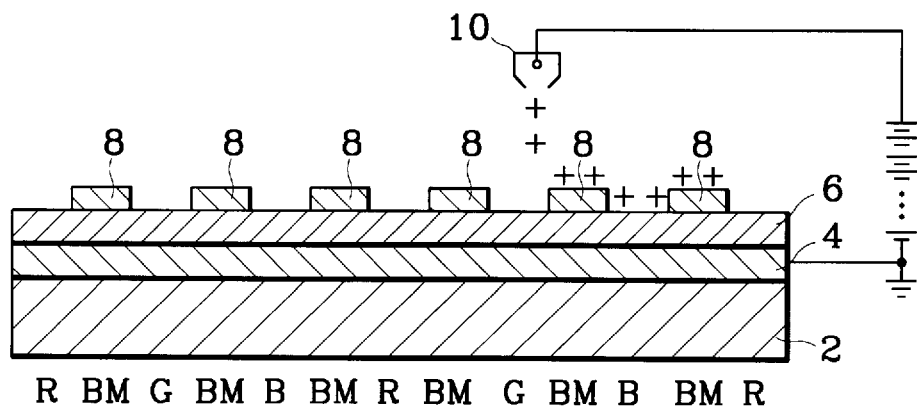
Figure 8:
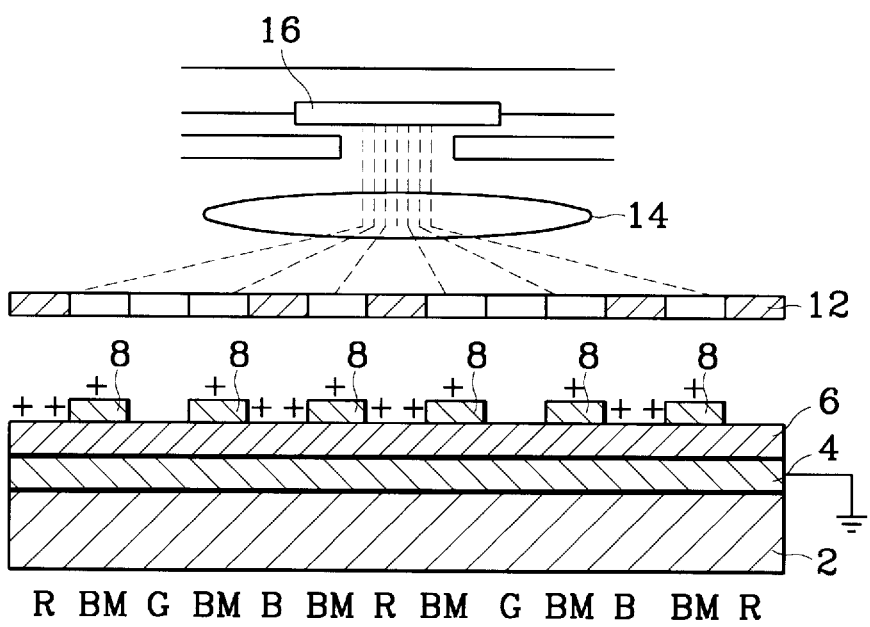
Figure 9:
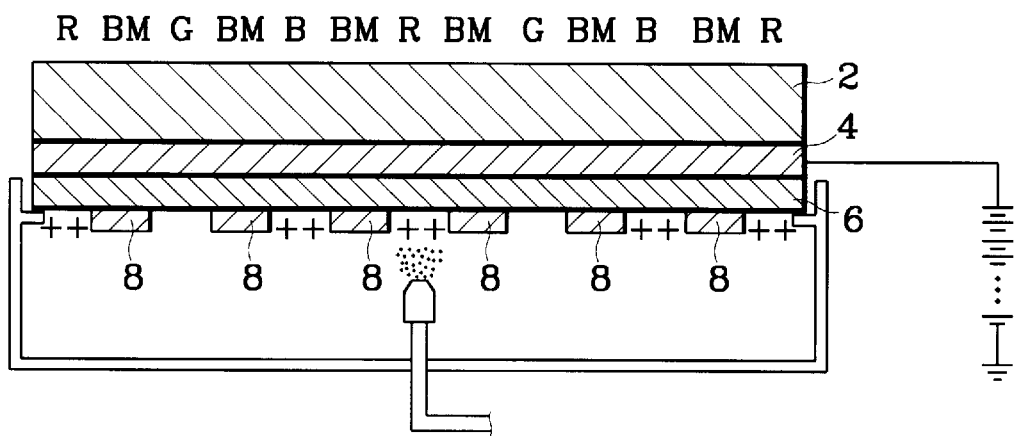
Figure 10:
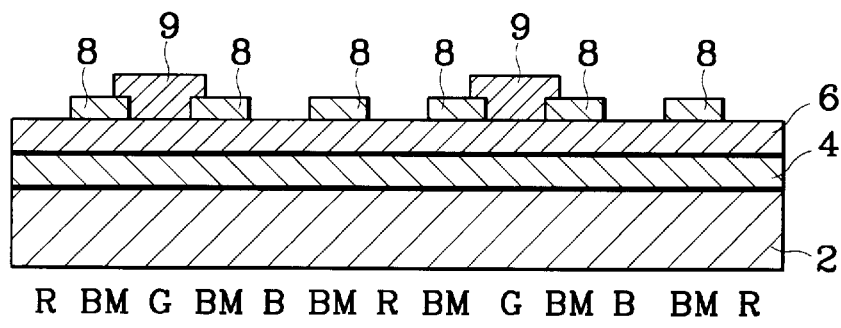

Both the organic photoconductive layer 6 and the black matrix 8 are electrostatically charged to a suitable potential using the corona discharge device 10 as shown in FIG. 7. The shadow mask 12 is then disposed to face the inner surface of the screen panel 2 to expose the organic photoconductive layer 6 to light from the light source 16 which projects light through the openings formed in the shadow mask 12. The light discharges the exposed areas of the organic photoconductive layer 6, where one of the red R, green G, and blue B phosphor materials (in this embodiment, the green G phosphor material) is deposited, such that the electrostatic potential of the exposed areas becomes zero as shown in FIG. 8. At this point, when a voltage lower than the remaining electrostatic potential is applied to the organic conductive layer, since the black matrix is made of a conductive material, the black matrix is charged to a positive electrostatic potential which is lower than that of the remaining electrostatic potential. In this state, when the positively charged phosphor particles are sprayed toward the panel, the particles are repelled by the positively charged areas on the organic photoconductive layer 6 and the black matrix 8 as shown in FIG. 9, while being deposited on the discharge areas. At this point, since the black matrix is charged to a relatively lower positive potential (i.e., has relatively lower repulsive force) the phosphor material 9 can be deposited such that its size is sightly larger than the discharge area. That is, the phosphor material slightly covers the black matrix so that the phosphor material can be densely deposited even around the boundary between each discharge area and the black matrix 8 as shown in FIG. 10. Finally, the deposited phosphor material 9 is fixed according to a conventional manner.

The above described steps for depositing the phosphor material are repeated for the rest of the phosphor materials (i.e., the red R and blue B phosphor materials).

Figure 11:
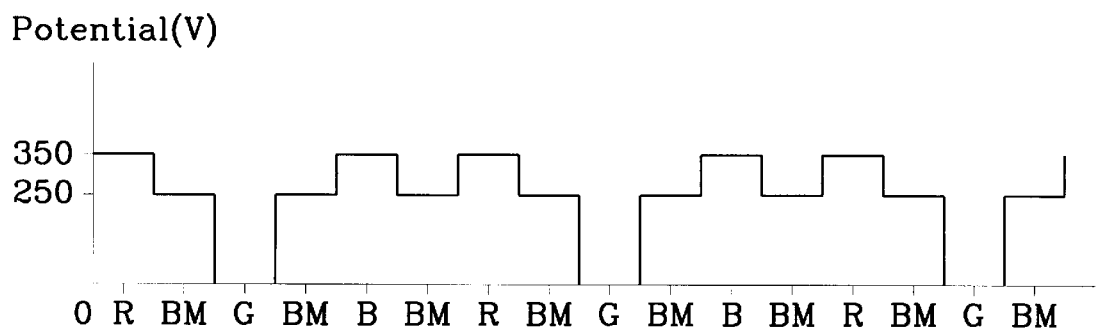
FIG. 11 is a graph illustrating an electrostatic potential charged during a developing process of a green(G) phosphor material according to a first embodiment of the present invention.

In the above embodiment, as shown in FIG. 11 it is preferable to charge the black matrix to an electrostatic potential of 250 V while the rest of the areas except the areas where the green G phosphor material will be deposited, are charged to an electrostatic potential of 350 V.

According to another embodiment of the present invention, during the exposure process, all areas, except areas where the green G phosphor material will be deposited are exposed so that the exposed areas can be discharged to an electrostatic potential of 0 V. And then, the green G phosphor material, which is charged to an opposite potential to that of the charged area (i.e., the area where the green G phosphor material will be deposited), is developed on the charged area.

Figure 12:
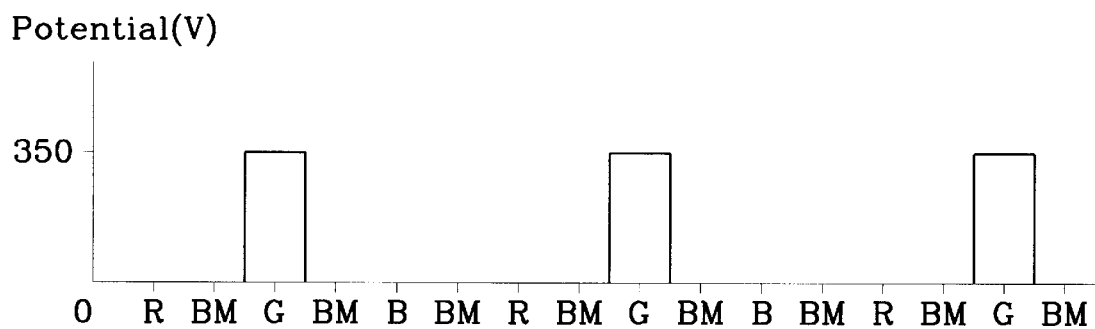
FIGS. 12 and 13 are graphs illustrating an electrostatic potential charged during a developing process of a green(G) phosphor material according to a second embodiment of the present invention.
Figure 13:
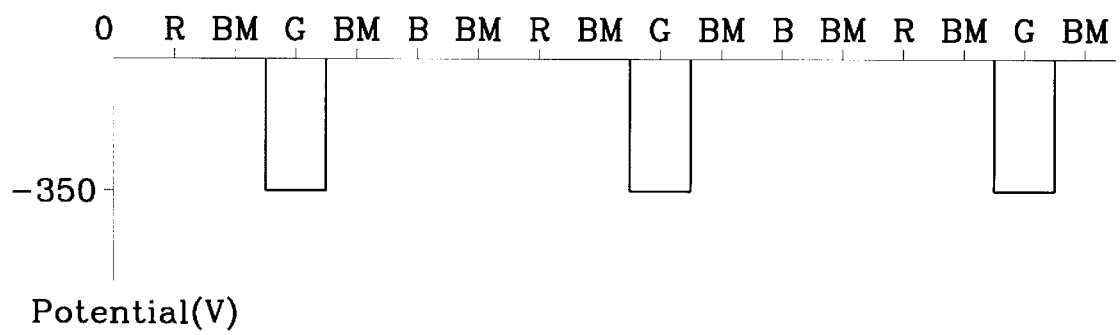

In this embodiment, it is preferable that the electrostatic potential of the area where the green G phosphor material will be deposited is about 350 V or −350 V as shown in FIGS. 12 and 13, respectively.

According to this embodiment, since a polarity of the charged areas is opposite to that of the green G phosphor material, these green G phosphor particles can be developed on the charged areas by attraction, whereby the phosphor material can be deposited even to the boundary between each charged area and the black matrix.

While this invention has been described in connection with what is presently considered to be the most practical and preferred embodiment, it is to be understood that the invention is not limited to the disclosed embodiments, but, on the contrary, is intended to cover various modifications and equivalent methods included within the spirit and scope of the appended claims.

What is claimed is:

1. A method for making a screen panel for a color cathode ray tube the screen panel having an organic conductive layer and an organic photoconductive layer, the method comprising the steps of:

(a) depositing a conductive black matrix on the photoconductive layer (b) electrostatically charging the photoconductive layer to a potential;

(c) exposing a portion of the charged photoconductive layer to light in a predetermined pattern so that the potential remains on an unexposed area of the photoconductive layer;

(d) applying a potential to the black matrix, said black matrix potential being lower than the remaining potential on the photoconductive layer; and (e) contacting a phosphor material having a same polarity as the remaining potential on the photoconductive layer so that the phosphor material is deposited on the photoconductive layer by repulsive force of the black matrix potential and the remaining potential on the photoconductive layer.

2. The method of claim 1 wherein the depositing step comprises the steps of:

charging the photoconductive layer to a potential;

exposing a portion of the charged photoconductive layer to light in a predetermined pattern so that the potential remains on an unexposed area of the photoconductive layer;

charging a wet black matrix material to an opposite potential to that remaining on the unexposed area of the photoconductive layer; and contacting the charged black matrix material with the photoconductive layer.

3. The method of claim 1 wherein the black matrix includes a graphite.

4. The method of claim 2 wherein the black matrix material includes a graphite.

5. The method of claim 1 wherein the phosphor material comprises a plurality of different color phosphors, and further comprising the steps of repeating steps (b) to (e) for each of the different color phosphors.

* * * * *